United States Patent [19]

Labuda et al.

[11] 3,932,232
[45] Jan. 13, 1976

[54] SUPPRESSION OF X-RAY RADIATION DURING SPUTTER-ETCHING

[75] Inventors: Edward Franklin Labuda, Allentown; William Dennis Ryden, Whitehall, both of Pa.

[73] Assignee: Bell Telephone Laboratories, Incorporated, Murray Hill, N.J.

[22] Filed: Nov. 29, 1974

[21] Appl. No.: 528,038

[52] U.S. Cl. ............................. 204/192; 204/298
[51] Int. Cl.² ..................................... C23C 15/00
[58] Field of Search .......................... 204/192, 298

[56] References Cited
UNITED STATES PATENTS

| | | | |
|---|---|---|---|
| 3,271,286 | 9/1966 | Lepselter | 204/192 |
| 3,410,775 | 11/1968 | Vratny | 204/192 |
| 3,526,584 | 9/1970 | Shaw | 204/192 |
| 3,617,463 | 11/1971 | Gregor et al. | 204/298 |
| 3,654,110 | 4/1972 | Kraus | 204/192 |
| 3,732,158 | 5/1973 | Przybyszewski et al. | 204/192 |
| 3,766,041 | 10/1973 | Wasa et al. | 204/192 |
| 3,864,239 | 2/1975 | Shima | 204/298 |

Primary Examiner—Howard S. Williams
Assistant Examiner—Aaron Weisstuch
Attorney, Agent, or Firm—H. W. Lockhart

[57] ABSTRACT

An attenuating member comprising a plurality of passages like a tube nest, is positioned between the electrodes of a diode sputter-etching system and close or next to the anode. The passages of the attenuating member are parallel to the direct path between the electrodes and have a length appreciably greater than their maximum width. A bias on the attenuating member tends to cause secondary electrons emitted by ion bombardment at the cathode to pass through the attenuating member with a minimum of collisions. Upon striking the anode, X-rays generated at the anode by the collision of the secondary electrons are inhibited from traveling back to the workpiece by the interposition of the attenuating member. The arrangement is important in the fabrication of surface-sensitive devices such as MOS devices in which the impingement of even low energy X-rays may affect critical operating parameters, in particular, the threshold voltage.

10 Claims, 2 Drawing Figures

SUPPRESSION OF X-RAY RADIATION DURING SPUTTER-ETCHING

This invention relates to fabrication of microelectronic devices and more particularly, to the fabrication of surface-sensitive semiconductor devices using sputter-etching.

BACKGROUND OF THE INVENTION

Sputter-etching, also referred to as backsputtering, has developed recently as an extremely useful technique for the controlled removal of material from surfaces, and particularly for selective removal of material using various masking arrangements. The technique is well known and generally involves a variation of the well-known sputter deposition process using ionized gases excited by a suitable radio frequency or A.C. potential to produce a glow discharge within an evacuated chamber. In sputter-etching, the workpiece from which material is to be removed is the target of the ion bombardment.

The sputter-etching process has inherent advantages for the fabrication of microelectronic elements particularly with respect to the chemical techniques which also are widely used to shape portions of such devices. Sputter-etching generally avoids the undercutting of masks encountered in chemical etching. The sputtering processes are less likely to produce undesirable contamination and the vacuum ambient lends itself to continuous processing including other steps of the fabrication procedure.

However, sputter-etching has a disadvantageous side effect particularly with respect to electronic elements which form the basis of surface-sensitive devices of the field effect type in which electronic control is exercised by electrodes overlaying insulating layers on semiconductor bodies. In particular, the devices of principal interest in this respect are the class known as insulated gate field effect transistors. When devices of this type are subjected to the ion impact process, which is the basis of sputter-etching, secondary electrons are produced at the surface of the electronic element as well as at the cathode surface upon which the elements are mounted. These secondary electrons are accelerated across the full cathode fall of potential localized near the cathode and then drift until they lose their energy through inelastic gas collisions, recombine, or strike the chamber walls or fixtures. In particular, it has been observed that the secondary electrons generated at the cathode strike the anode with a maximum energy corresponding to the maximum cathode to anode potential. Low energy X-rays are thereby produced, some of which, at least, then impinge upon the surface of the electronic element. Even low energy X-rays are able to alter the surface conditions of these elements and thereby affect various parameters of the final devices. In particular, the threshold voltage, which is determinative of the turn-on voltage of an IGFET, is sensitive to X-ray radiation.

Accordingly, it is the object of this invention to suppress such X-rays generated during the sputter-etching process in a diode sputtering system.

SUMMARY OF THE INVENTION

In accordance with this invention, in a diode sputtering system, an attenuating member is positioned between the two electrodes and close, or next to, the anode. The attenuating member may be biased at a potential between that of the cathode upon which the workpiece or electronic element is mounted and the potential at the anode. Typically, the cathode is at a large negative potential and the anode is grounded. Thus the attenuating member would be held slightly more negative than ground. Thus, the attenuating member provides easy passage of secondary electrons from the cathode to the anode with a minimum of collisions with metal structure during passage, while at the same time rendering the return passage of X-rays generated at the anode, and tending to return toward the workpiece mounted on the cathode, extremely difficult. To this end the attenuating member comprises an array of parallel passages formed by thin wall partitions, and having a configuration much like a tube nest or honeycomb open at both ends. Typically the passages have a length at least several times greater than their maximum width.

Thus, secondary electrons moving from the cathode to the anode experience sufficient repelling force as they traverse the attenuating member to inhibit collision with the walls thereof. Upon reaching the anode the collision of the secondary electrons generates low energy X-rays. The major portion of this radiation is referred to as bremsstrahlung which has a minimum radiation in the direction of the incident secondary electron which produced it. Thus the major portion of this X-ray radiation will be absorbed by the attenuating member. The minor portion of the X-ray radiation, which is referred to as the characteristic radiation, has an isotropic angular dependence and so will have a portion tending to return along the direct path back to the cathode. However, this has been found not to be significant in affecting the workpiece.

Generally, the greater the ratio of the length to width dimension of the passages of the attenuating member, the more effective will be the attenuation. It will be advantageous also to utilize lighter metals, both for the attenuating member and the anode member inasmuch as these members then will decelerate the secondary electrons to a lesser degree and therefore generate a lesser amount of X-ray radiation.

The effectiveness of the attenuating member is in part, a function of the length-to-width ratio of its passages and typically will be at least about 5 to 1. The attenuating member may be positioned next to the anode as an integral part thereof, or, it may be spaced away or otherwise insulated from the anode to permit a potential difference therebetween either by a self-biasing effect or by the application of an external voltage.

THE DRAWING

A better understanding of the invention and its further objects and features will be apparent from the following detailed description taken in conjunction with the drawing in which:

FIG. 1 is an elevational perspective view of one embodiment in accordance with the invention; and FIG. 2 is a schematic representation of the particular cooperating members, namely the electrodes and attenuating member of an embodiment in accordance with this invention.

DETAILED DESCRIPTION

Figure 1:
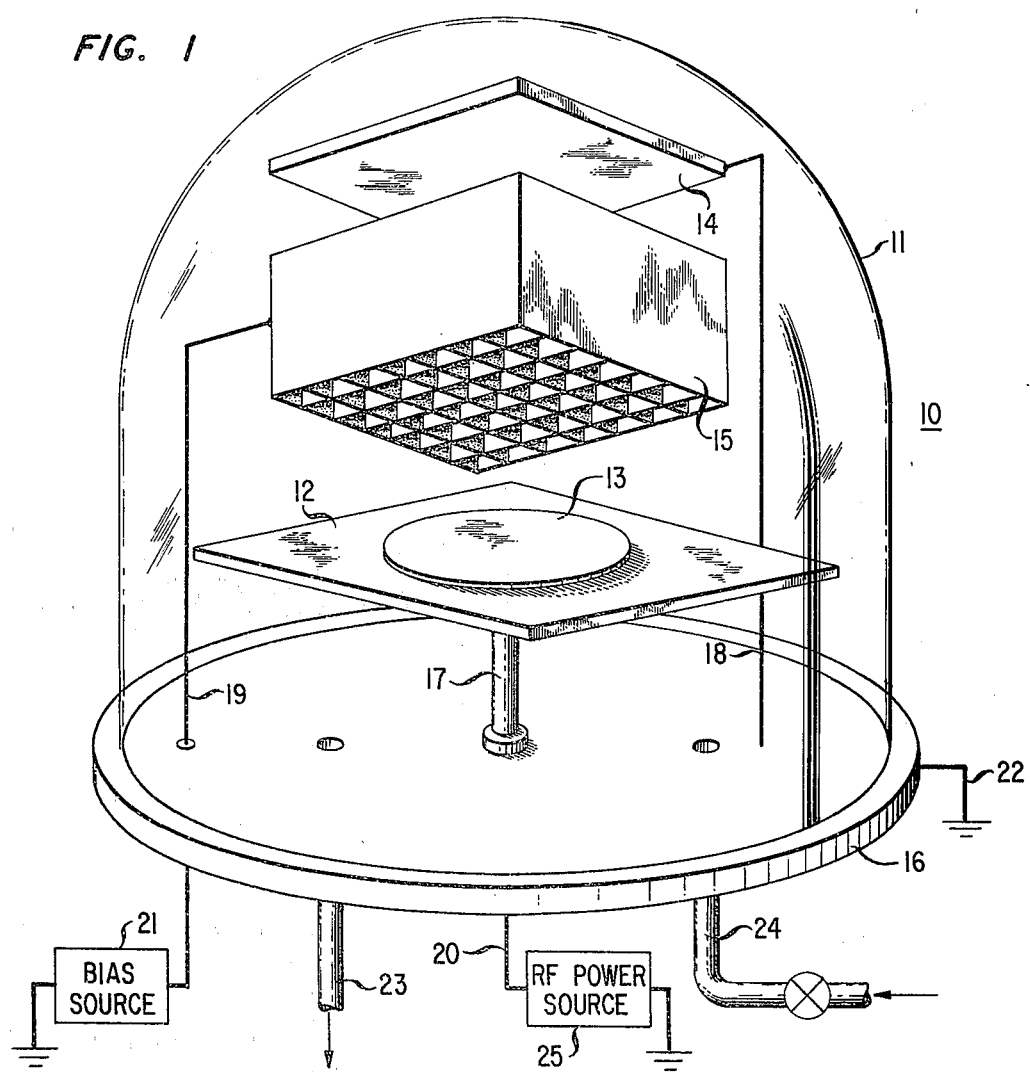

One specific embodiment in accordance with this invention is shown in elementary form in FIG. 1. It will be understood that dimensions are exaggerated in certain respects and that certain aspects of the drawing are greatly simplified to lend clarity to the explanation. The apparatus 10 is a diode sputtering apparatus comprising a bell jar 11 mounted on a base member 16 to form an evacuable chamber. Within the bell jar 11 are electrodes 12 and 14 comprising a cathode and anode respectively. A workpiece 13 is shown mounted on the cathode surface and constitutes the electronic element upon which the system is to operate.

Typically, in the context of this invention the electronic element which comprises workpiece 13 is a semiconductor wafer of standard diameter, generally 2 or 3 inches, in which an array of individual semiconductor devices are to be fabricated. This aspect of semiconductor device fabrication is well known and involves the use of photolithographic techniques, controlled impurity introduction by methods such as diffusion and ion implantation and oxide masking to form arrays of perhaps several hundred or more identical semiconductor devices. In the context of this invention the workpiece 13 typically is a semiconductor wafer which has undergone fabrication processing to form within it the impurity regions which will define the ultimate semiconductor devices. They are not yet devices but will become so when separated into individual chips with the necessary conductive interconnections and provisions for external connection. The workpiece 13 will be referred to herein as an electronic element to indicate its intermediate state in the fabrication process. Sputter-etching apparatus may be adapted to accommodate a plurality of wafers.

The sputter-etching for which the apparatus shown is adapted typically effects the selective removal of portions of metal films to thereby define metallization patterns for each of the devices within the semiconductor wafer. Sputter-etching is also capable of performing other functions on the surface of the workpiece 13 inasmuch as ion bombardment can remove a wide variety of materials.

In sputter-etching, as in sputter deposition, a glow discharge space is produced between the cathode 12 and anode 14 when a potential is applied therebetween and the chamber contains an ionizable gas at reduced pressure. Such a condition is achieved by coupling evacuation means to the connection 23 in the base member 16 and introducing a gas, typically argon, through the connection 24. Electrical connections are shown in diagrammatic form to both electrodes. The cathode 12 is coupled by means of the mounting pedestal 17 and lead 20 to a RF power source 25 while the anode 14 is connected by lead 18 to the base member 16 and, in turn, to ground by way of lead 22. It is possible to sputter-etch using D.C. but the process is not as advantageous as RF because, in some instances, the D.C. potential may cause the electrical breakdown of insulators which are an integral part of the electronic element being sputter-etched.

In accordance with this invention an X-ray attenuating member 15 is mounted between the electrodes 12 and 14 and in juxtaposition to the anode 14. As shown in FIG. 1 member 15 is intended to be shown as closer to the anode 14 than to cathode 12. As previously noted, it can be placed in contact with the anode. This member 15 has the appearance of a tube nest or honeycomb and comprises a large number of parallel passages in alignment with the direct path between the electrode surfaces. These passages have a length considerably greater, at least about 5 or more times, than their maximum width. As will be explained more fully hereinafter, the attenuating member 15 effectively suppresses the X-ray radiation generated by collisions of secondary electrons by acting first as a collimating agent for the secondary electrons generated in the vicinity of the cathode 12 and then as an absorbent baffle for the X-ray radiation generated at the anode 14.

Typically the electrodes 12 and 14 are of metal such as stainless steel or aluminum and the attenuating member 15 likewise is metallic and conductive inasmuch as it is connected by way of lead 19 to a bias source 21 which advantageously maintains the member 15 at a potential level between that of the cathode and anode and just slightly more negative than the anode. Although a variety of metals may be used for the attenuating member, and the anode as well, it is advantageous to use a comparatively light metal such as aluminum, carbon or beryllium inasmuch as these metals slow the electrons down in a manner which generates a lesser amount of X-ray radiation. The choice of material for the attenuating member is governed not only by the desirability of a slower deceleration of electrons but also by the thermal characteristics of the material and the capability of the attenuating member 15 for avoiding undue buildup of heat.

The attenuating member 15 may be integral with the anode 14 and therefore also at ground potential. If the attenuating member 15 is spaced away or otherwise insulated from anode 14 it is advantageous to apply a slight negative voltage to the attenuating member thus placing it at a potential level between the anode and cathode. This potential repels the secondary electrons thus inhibiting their collision with the attenuating member. It appears also, that the use of an exciting RF produces a standing wave that results in a desirable negative self-bias. Furthermore, if the attenuating member 15 is of a metal such as aluminum which readily forms a dielectric oxide, the passage of the electrons over the oxide coated metal tends to induce a charge which produces a slight negative potential, thus also self-biasing the attenuating member.

Although the attenuating member 15 is shown as an array of passages generally square in cross section, a variety of configurations may be utilized. They may be circular and the member comprised of an array of metal tubes bound together in a tube nest. Likewise a honeycomb of hexagonal passages may be used.

As is known, the application of a potential, typically an RF frequency of between about 1 and 10 KV at a frequency of 1 to 30 MHZ, between the cathode 12 and anode 14 produces a glow discharge in the space between the electrodes. Gas ions formed within the glow discharge are accelerated through the cathode fall region which forms adjacent the cathode, and then impact upon the workpiece surface. It is this ion impact which produces the sputter-etching action and causes material to be removed from the impacted surface. A consequence of this ion bombardment is the generation of secondary electrons at the point of impact which are influenced primarily by the dark space formed near the electrode 12. The dark space corresponds to the cathode fall and is the volume across which the greater portion of the potential drop between the electrodes occurs. This dark space has the effect of directing the secondary electrons outwards toward the anode into an essentially field free zone through which they then travel in substantially straight paths toward the anode 14.

Figure 2:
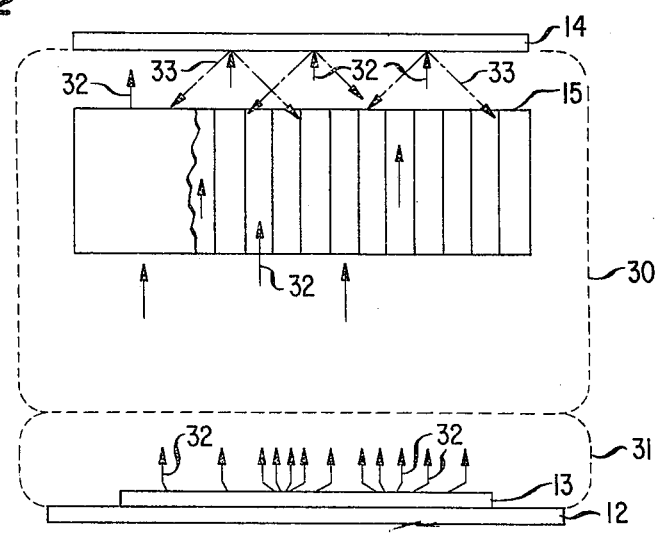

This action is depicted schematically in FIG. 2 in which the members corresponding to those of FIG. 1 have like reference numerals. The glow discharge region and the dark space are represented approximately by dotted outlines 30 and 31 respectively. The arrowed lines 32 emanating from the surface of the workpiece 13 represent secondary electrons generated by ion bombardment at the surface. As shown in this schematic representation, the secondary electrons travel in substantially straight paths through the field-free zone and then through the attenuating member 15 to the anode 14. If the attenuating member 15 is separated from the anode 14 and biased slightly negative as shown, an additional collimating effect is provided tending to inhibit collisions of secondary electrons 32 with the member 15. The attenuating member 15 should have a minimum cross section by making the walls as thin as possible and also, it is desirable to shape the leading edges, facing the cathode, as knife edges, to reduce the likelihood of collisions. Specifically, the attenuating member cross-sectional area transverse to the secondary electron path should be not more than about one-tenth the area of the cathode face.

As is known, X-ray radiation is generated by collision of the electrons with solid elements. Accordingly, to suppress the generation of X-ray radiation at the attenuating member it is important to reduce the possibility of collisions. The attenuating member 15 comprises a plurality of passages parallel to the direct path between cathode 12 and anode 14 to enhance the possibility that the secondary electrons 32 will pass through without collision and impinge upon the anode 14 beyond.

Generally, in the sputter-etching process the major portion of the secondary electron flow impacts upon the anode 14 and X-ray radiation is generated at that surface. The paths of this X-ray radiation are depicted in general form by the dotted arrowed lines 33 emanating from the impact points of the secondary electrons on the surface of the anode 14. It can be seen from FIG. 2 that the bulk of the X-ray radiation is absorbed by the attenuating member 15 and that passage of the radiation toward the cathode is thereby suppressed as previously described. It is known that X-rays impinging upon the surface of an electronic element of the insulated gate, field effect type seriously affects the charge condition at critical interfaces within the electron element. Ultimately this may produce deterioration in the desired parameters of the devices or render them unstable. In particular, low energy X-ray flux produces an undesirable shift in threshold voltage.

The suppressive effect of the attenuating member 15 on X-ray radiation produced at the anode is a function of the length-to-width ratio of its passages. Additionally, for an attenuating member of given dimensions, the suppressive effect increases as the spacing between it and the anode increases. In particular, the end of the attenuating member closer to the cathode constitutes the array of exit orifices for X-rays seeking to return to the cathode. Accordingly, as the distance increases between the anode and the end of the attenuating member closer to the cathode, the smaller the angle subtended by the exit orifice (tube end) and having its apex at a point on the anode. Thus, for an attenuating member of given length, width and size of passages, an X-ray generated at a point on the anode by the impact of a secondary electron has a more restricted route if the subtended angle is smaller in order to avoid the attenuating member and escape to reach the cathode.

There are, of course, practical limitations upon both the size of the attenuating member and its spacing from the electrodes.

In a specific embodiment of an RF Diode Sputter Etch Apparatus, the cathode to anode spacing was eight inches. An attenuating member comprised a nest of stainless steel tubes, 1 inch in diameter, 6 inches long, and having a wall thickness of 0.015 inches, mounted directly on the face of the anode. Thus, the spacing from the cathode to the tube ends was 2 inches. The operating pressure within the sputtering chamber was 18 microns gas (argon) and 2 microns air. The RF voltage was 1.8 KV at 13.7 megahertz with a power density of 2 watts per square centimeter of cathode area and the cathode was 10 inches in diameter. For the structure described, the area of the cathode was 78.5 square inches and the cross-sectional area of the attenuating member was slightly less than four square inches, and thus about one-twentieth of the cathode area. Under these conditions the sputter-etch rate for gold was about 800 A/min. In tests conducted by sputter-etching metal layers from the surfaces of insulated gate field effect transistors of the type having polycrystalline silicon for the gate electrode, those processed without the X-ray attenuating member showed an undesired negative shift of the threshold voltage of from one to two volts, whereas those processed with the shield exhibited no detectable threshold voltage shift.

What is claimed is:

1. A sputter-etching system for removing material from a workpiece which includes,
    1. an evacuable chamber adapted to contain a reduced pressure ionizable gas atmosphere therein,
    2. a cathode and an anode in said chamber, said cathode having means for mounting said workpiece in association therewith,
    3. voltage means for applying a potential between said cathode and anode for producing a glow discharge therebetween,
    4. characterized in that an X-ray attenuating member is interposed between said anode and cathode and in juxtaposition to said anode, said attenuating member comprising a plurality of passages defined by thin walls generally parallel to the direct path between said cathode and anode, said passages having a length dimension large in comparison to their maximum width dimension.

2. Apparatus in accordance with claim 1 in which said attenuating member is in contact with said anode.

3. Apparatus in accordance with claim 1 in which said attenuating member is spaced away from said anode.

4. Apparatus in accordance with claim 1 in which said passages have a length at least about 5 times greater than their width dimension.

5. Apparatus in accordance with claim 1 in which the cross-sectional area of said attenuating member transverse to said direct path is not more than about one-tenth the area of the surface of said cathode.

6. Apparatus in accordance with claim 3 including means for biasing said attenuating member to a potential level between that of said anode and that of said cathode.

7. In a process for sputter-etching an electronic element by the formation of a glow discharge region between a pair of electrodes in a reduced pressure chamber containing an ionized gas, the method of suppressing the impingement of X-rays produced within said chamber upon the electronic element comprising mounting an X-ray attenuating member in the path between the two electrodes, said member having a plurality of passages parallel to the path between said electrodes, the passages having a length dimension at least several times their maximum width dimension.

8. The method in accordance with claim 7 in which said attenuating member is mounted in contact with one of said electrodes.

9. The method in accordance with claim 7 in which said attenuating member is mounted in spaced-away relation to both of said electrodes.

10. The method in accordance with claim 9 including the step of applying a potential to said attenuating member to bias it at a level between the respective potential levels of said electrodes.

* * * * *